US012750055B2

(12) United States Patent
Reiter et al.

(10) Patent No.: US 12,750,055 B2
(45) Date of Patent: Sep. 29, 2026

(54) DEVICE AND METHODS FOR SWITCH CONTROL

(71) Applicant: Microchip Technology Incorporated, Chandler, AZ (US)

(72) Inventors: Andreas Reiter, Feldkirchen-Westerham (DE); Yong Yuenyongsgool, Gilbert, AZ (US); Stephen Bowling, Chandler, AZ (US); Tim Phoenix, Pepperell, MA (US); Alex Dumais, Boise, ID (US); Justin Oshea, Chandler, AZ (US)

(73) Assignee: Microchip Technology Incorporated, Chandler, AZ (US)

( * ) Notice: Subject to any disclaimer, the term of this patent is extended or adjusted under 35 U.S.C. 154(b) by 80 days.

(21) Appl. No.: 18/243,723

(22) Filed: Sep. 8, 2023

(65) Prior Publication Data

US 2024/0088893 A1 Mar. 14, 2024

Related U.S. Application Data

(60) Provisional application No. 63/404,931, filed on Sep. 8, 2022.

(51) Int. Cl.
*H03K 17/693* (2006.01)
*H03K 17/687* (2006.01)

(52) U.S. Cl.
CPC ....... *H03K 17/693* (2013.01); *H03K 17/6871* (2013.01)

(58) Field of Classification Search
CPC ............ H03K 17/693; H03K 17/6871; H03K 2217/0063; H03K 2217/0072; H03K 17/0822; H03K 17/08122
See application file for complete search history.

(56) References Cited

U.S. PATENT DOCUMENTS 10,637,348 B1 * 4/2020 Wu .................... H03K 17/6871
2006/0054938 A1 * 3/2006 Honda ............ H03K 17/08122 257/232
2009/0108884 A1 * 4/2009 Dagli .................... H03F 3/2171 327/109
2009/0243744 A1 * 10/2009 Beale .................... H03F 3/2173 332/109
2009/0295341 A1 * 12/2009 Nakamura .......... H02M 3/1588 323/222

(Continued)

OTHER PUBLICATIONS

International Search Report and Written Opinion, Application No. PCT/US2023/032277, 12 pages.

*Primary Examiner* — Metasebia T Retebo
(74) *Attorney, Agent, or Firm* — SLAYDEN GRUBERT BEARD PLLC

(57) ABSTRACT

A device includes a PWM circuit to generate a complementary PWM signal comprised of a positive polarity PWM signal and a negative polarity PWM signal. The positive polarity signal may drive a high-side switch. A trigger multiplexer may take as input the negative polarity PWM signal and may force an output based on a predetermined condition, the predetermined condition including but not limited to the maximum on-time of a low-side switch. The output of the trigger multiplexer may drive a low-side switch. The high-side switch and the low-side switch may drive a load.

20 Claims, 2 Drawing Sheets

(56) References Cited

U.S. PATENT DOCUMENTS

| | | | | |
|---|---|---|---|---|
| 2013/0147458 | A1* | 6/2013 | Zhak | H02M 3/158<br>323/311 |
| 2014/0240020 | A1* | 8/2014 | Kris | H02M 1/08<br>327/241 |
| 2019/0245339 | A1 | 8/2019 | Chang et al. | |

* cited by examiner

DEVICE AND METHODS FOR SWITCH CONTROL

PRIORITY

This application claims priority to commonly owned U.S. Patent Application No. 63/404,931 filed on Sep. 8, 2022, the entire contents of which are hereby incorporated by reference for all purposes.

FIELD OF THE INVENTION

The present disclosure relates to systems and methods for control of a low-side switch in a switched power converter.

BACKGROUND

In power converter applications, a low-side PWM output signal may be used to control a synchronous rectifier switch which allows the power filter to freewheel during the off-time of the low-side switch. While in discontinuous conduction mode, however, it is not efficient or desirable to maintain fully synchronous operation or to completely turn off the switch using FET body diodes for rectification.

There is a need for a solution to emulate body diode conduction in a power converter.

SUMMARY

The examples herein enable a circuit which may control the low-side drive signal in a power converter.

According to one aspect, a device for switch control may include a pulse-width modulator (PWM) circuit. The PWM modulator circuit may receive an input signal and may output a positive polarity PWM signal and a negative polarity PWM signal, where the negative polarity PWM signal is the complement of the positive polarity signal. The system may include an AND gate with a first input coupled to a trigger event signal and a second input coupled to a low-side active control signal. The system may include a trigger multiplexer with a first input coupled to the negative polarity PWM signal, a second input coupled to a logic low level, and a select input coupled to the output of the AND gate. The trigger multiplexer may generate a low-side drive signal, the low-side drive signal may be forced to a logic low level based on the output of the AND gate. The system may include a low-side switch with a gate node coupled to the low-side drive signal, a source node coupled to a fixed voltage, and a drain node coupled to a load. The system may include a high-side switch with a gate node coupled to the positive polarity PWM signal, a source node coupled to a supply voltage, and a drain node coupled to a load.

According to one aspect, a system includes a pulse-width modulator (PWM) circuit, the PWM circuit to output a positive polarity PWM signal and a negative polarity PWM signal. The negative polarity PWM signal may be the complement of the positive polarity signal. A PWM conditioning circuit may be coupled to the outputs of the PWM circuit. The PWM conditioning circuit may modify the positive polarity PWM signal, and may modify the negative polarity PWM signal. The PWM conditioning circuit may output a high-side drive signal and a low-side drive signal and the PWM conditioning circuit may force the low-side drive signal to an inactive state based on a predetermined condition. A low-side switch includes a gate node coupled to the low-side drive signal, a source node coupled to a fixed voltage, and a drain node coupled to a load. A high-side switch includes a gate node coupled to the high-side drive signal, a source node coupled to a supply voltage, and a drain node coupled to the load.

According to one aspect, a method includes operations of: generating a positive polarity PWM signal and a negative polarity PWM signal, the negative polarity PWM signal the complement of the positive polarity PWM signal, modifying the positive polarity PWM signal to generate a high-side drive signal, forcing the negative polarity PWM signal to an inactive state based on a predetermined condition to generate a low-side drive signal, driving a low-side switch with the low-side drive signal, and driving a high-side switch with the high-side drive signal.

DETAILED DESCRIPTION

Figure 1:
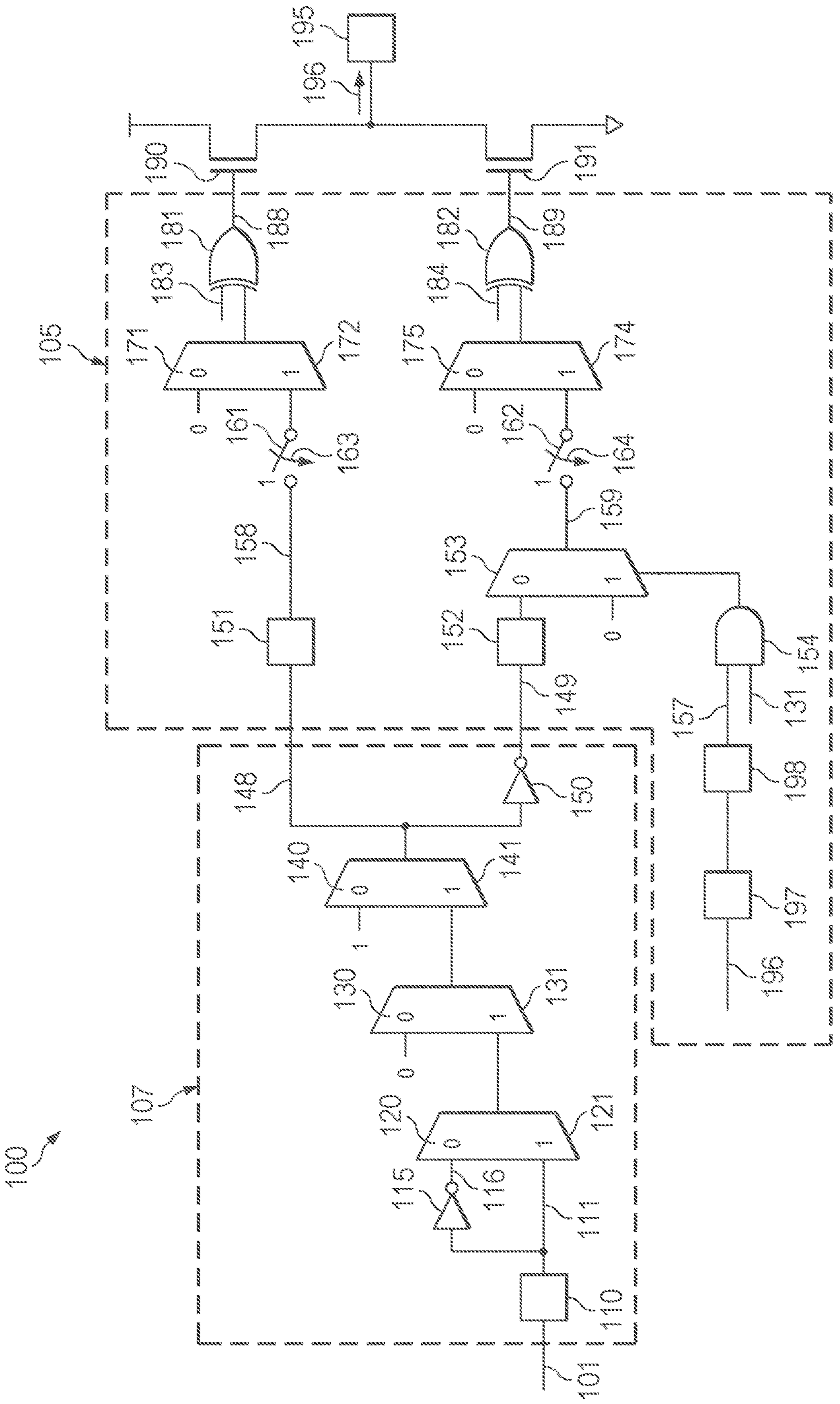
FIG. 1 illustrates one of various examples of a system for control of the on-time in a low-side switch in a power converter.

FIG. 1 illustrates one of various examples of a device 100 for control of PWM gate drive signals. Device 100 may comprise, or be implemented in a microcontroller.

Input signal 101 may be input to PWM generator 110. PWM generator 110 may output a PWM signal 111. Inverter 115 may invert PWM signal 111 to produce complementary PWM signals at the inputs of swap multiplexer 120. Swap signal 121 may enable swap multiplexer 120 to output the inverted PWM signal 116 when swap signal is de-asserted, and may enable swap multiplexer 120 to output PWM signal 111 when swap signal is asserted. This polarity of swap signal 121 is not intended to be limiting. In other examples, swap signal 121 may enable swap multiplexer 120 to output the inverted PWM signal 116 when swap signal is asserted, and may enable swap multiplexer 120 to output PWM signal 111 when swap signal is de-asserted. Swap multiplexer 120 may comprise a swap circuit.

The output of swap multiplexer 120 may be input to first multiplexer 130. First multiplexer 130 may implement a low-side drive control. Low-side active control signal 131 may be coupled to the select input of first multiplexer 130. When low-side active control signal 131 is asserted, first multiplexer 130 may output the PWM output of swap multiplexer 120. When low-side active control signal 131 is deasserted, the output of first multiplexer 130 may be set to logic low.

The output of first multiplexer 130 may be input to second multiplexer 140. Second multiplexer 140 may implement a high-side drive control. High-side active control signal 141 may be coupled to the select input of second multiplexer 130. When high-side active control signal 141 is asserted, second multiplexer 140 may output the signal received from first multiplexer 130. When high-side active control signal 141 is deasserted, the output of second multiplexer 140 may be set to logic high.

In this manner, the PWM output of swap multiplexer 120 may reach the output of second multiplexer 140 when both low-side active control signal 131 and high-side active control 141 are asserted. The output of second multiplexer 140 may be input to inverter 150.

PWM generator 110, inverter 115, swap multiplexer 120, first multiplexer 130, second multiplexer 140, and inverter 150 may be termed a PWM circuit 107. PWM circuit 107 may generate complementary PWM signals at the outputs of second multiplexer 140 and inverter 150, respectively. The outputs of PWM circuit 107 may be input to PWM conditioning circuit 105.

The output of second multiplexer 140 may be input to high-side dead-time generator 151. The output of inverter 150 may be input to low-side dead-time generator 152. The output of second multiplexer 140 and the output of inverter 150 may be a complimentary PWM signal comprising positive polarity PWM signal 148 and negative polarity PWM signal 149. High-side dead-time generator 151 may generate output 158 and low-side dead-time generator 152 may generate output 159. Output 158 and output 159 may have a predetermined dead-time, a time when both output 158 and output 159 may be de-asserted. During the predetermined dead-time, none of the output switches may be in a closed position.

The output of low-side dead-time generator 152 may be input to trigger multiplexer 153.

In one of various examples, trigger event signal 157 may be output from CPU 198 based on a calculation of maximum on-time of low-side switch 191 and input to a first input of AND gate 154. In other examples, trigger event signal 157 may be generated by PWM generator 110 and input to the first input of AND gate 154.

In other examples, load current 196 may be input to an optional analog-to-digital converter (ADC) 197. The output of ADC 197 may be input to central processing unit (CPU) 198, which may output trigger event signal 157. The second input of AND gate 154 may be coupled to receive low-side active control signal 131. In other examples, trigger event signal 157 may be generated by a circuit not specifically mentioned.

In operation, when low-side active control signal 131 and trigger event signal 157 are asserted, trigger multiplexer 153 may output a logic low level, which may force the low-side PWM drive signal 189 low, which may force low-side switch 191 to an inactive state.

The output of high-side dead time generator 151 may be input to a first switch 161. First switch 161 may be controlled by high-side force signal 163. When high-side force signal 163 is asserted, first switch 161 may connect to logic high. When high-side force signal 163 is de-asserted, first switch 161 may connect the output of high-side dead time generator 151 to a second input of high-side multiplexer 171.

A first input of high-side multiplexer 171 may be coupled to a logic low level. High-side inactive control signal 172 may be coupled to the select input of high-side multiplexer 171. When high-side inactive control signal 172 is de-asserted, high-side multiplexer 171 may output logic low to disable high-side switch 190.

The output of trigger multiplexer 153 may be input to a second switch 162. Second switch 162 may be controlled by low-side force signal 164. When low-side force signal 164 is asserted, second switch 162 may connect to logic high. When low-side force signal 164 is de-asserted, second switch 162 may connect the output of trigger multiplexer 153 to a second input of low-side multiplexer 175.

A first input of low-side multiplexer 175 may be coupled to a logic low level. Low-side inactive control signal 174 may be coupled to the select input of low-side multiplexer 175. When low-side inactive control signal 174 is de-asserted, low-side multiplexer 175 may output logic low to disable low-side switch 191.

High-side polarity select signal 183 may be coupled to a first input of high-side XOR gate 181. The output of high-side multiplexer 171 may be coupled to a second input of high-side XOR gate 181. High-side polarity select signal 183 may, when asserted, operate as an inverter to reverse the polarity of the output of high-side multiplexer 171. The output of high-side XOR gate 181 may be high-side gate drive signal 188. High-side gate drive signal 188 may be coupled to the gate node of high-side switch 190.

Low-side polarity select signal 184 may be coupled to a first input of low-side XOR gate 182. The output of low-side multiplexer 175 may be coupled to a second input of low-side XOR gate 182. Low-side polarity select signal 184 may, when asserted, operate as an inverter to reverse the polarity of the output of low-side multiplexer 175. The output of low-side XOR gate 182 may be low-side gate drive signal 189. Low-side gate drive signal 189 may be coupled to the gate node of low-side switch 191.

High-side switch 190 and low-side switch 191 may drive load 195. Load current 196 may be consumed by load 195.

PWM conditioning circuit 105 may condition the complementary PWM outputs of PWM circuit 107. PWM conditioning circuit 105 may output high-side gate drive signal 188 to high-side switch 190, and may output low-side gate drive signal 189 to low-side switch 191.

In operation, trigger event signal 157 may set a maximum on-time for low-side switch 191. The path from trigger event signal 157, through AND gate 154, trigger multiplexer 153 and to low-side gate drive signal 189 may force low-side gate drive signal low, i.e. to an inactive state, once the maximum on-time has been reached by asserting trigger event signal 157 so as to pass an asserted low-side active control signal 131 to trigger multiplexer 153, thereby setting the output of trigger multiplexer 153 to a logic low.

In the example illustrated in FIG. 1, switch 162 has logical priority, and may force the value of low-side drive signal 189 to a logic high, independent of the value of trigger event signal 157.

The examples illustrated in FIG. 1 include an n-channel high-side switch 190 and an n-channel low-side switch 191, but this is not intended to be limiting. A drain of the n-channel high-side switch 190 is coupled to a supply voltage, and a source of the n-channel high-side switch 190 is coupled to load 195. A drain of the n-channel low-side switch 191 is coupled to load 195 and a source of the n-channel low-side switch 191 is coupled to a fixed voltage, such as a return for the supply voltage, or ground. Other switch technologies may be utilized.

Figure 2:
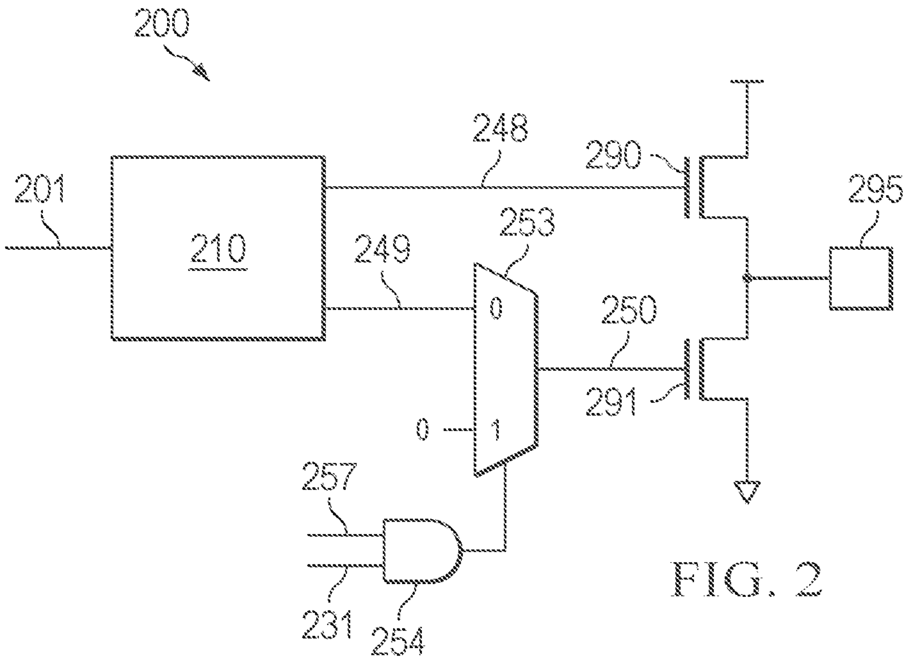
FIG. 2 illustrates one of various examples of a device for control of the on-time in a low-side switch in a power converter.

FIG. 2 illustrates one of various examples of a device 200 for control of the on-time in a low-side switch in a power converter.

Input signal 201 may be input to PWM circuit 210. PWM circuit 210 may output a positive polarity PWM signal 248 and a negative polarity PWM signal 249. Positive polarity PWM signal 248 and negative polarity PWM signal 249 may comprise complementary PWM signals.

Negative polarity PWM signal 249 may be input to a first input of trigger multiplexer 253. A second input of trigger multiplexer 253 may be coupled to a logic low level.

The select input of trigger multiplexer 253 may be coupled to the output of AND gate 254. A first input of AND gate 254 may be coupled to trigger event signal 257. In one of various examples, trigger event signal 257 may be based on a maximum on-time of low-side switch 291.

Trigger event signal 257 may be input from a microcontroller, from PWM circuit 210 or from another circuit not specifically mentioned.

A second input of AND gate 254 may be coupled to low-side active control signal 231. Low side active control signal 231 may be input from a non-transitory memory register, from a microcontroller output, or from a circuit not specifically mentioned.

In operation, AND gate 254 may force the output of trigger multiplexer 253 to a logic low level when low-side active control signal 231 and trigger event signal 257 are at logic high levels.

The output of trigger multiplexer 253 may be low-side drive signal 250. Low-side drive signal 250 may be coupled to a gate input of low-side switch 291. Positive polarity PWM signal 248 may also be termed high-side drive signal. Positive polarity PWM signal 248 may be coupled to a gate input of high-side switch 290. Low-side switch 291 and high-side switch 290 may drive load 295.

In operation, trigger multiplexer 253 may force low-side switch 291 to an inactive state. In one of various examples, trigger multiplexer 253 may force low-side switch 291 to an inactive state based on the maximum on-time of low-side switch 291.

Other circuits (not shown) may further modify the output of trigger multiplexer 253 and may drive low-side switch 291.

Figure 3:
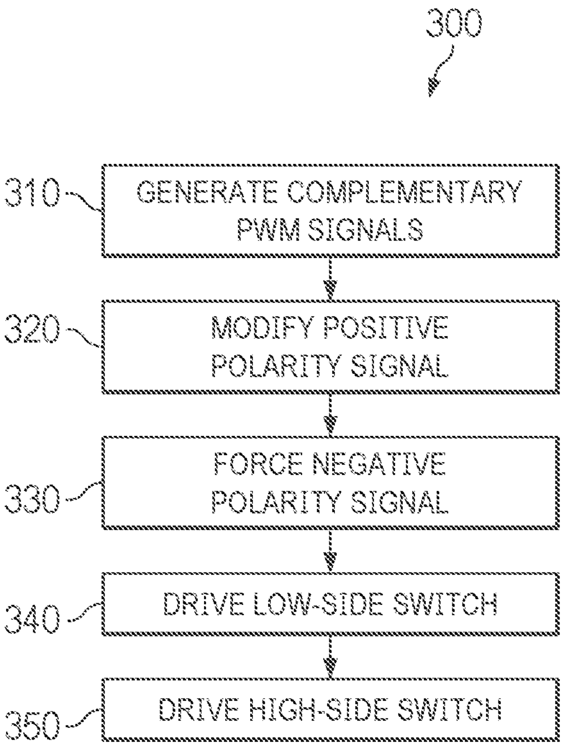
FIG. 3 illustrates a method of control of the on-time in a low-side switch in a power converter.

FIG. 3 illustrates a method of control of the on-time in a low-side switch in a power converter.

At operation 310, complementary PWM signals may be generated by a PWM generator circuit, the complementary PWM signals comprising a negative polarity PWM signal and a positive polarity PWM signal.

At operation 320, the positive polarity PWM signal may be modified to generate a high-side drive signal.

At operation 330, the negative polarity PWM signal may be forced to an inactive state based on a predetermined condition to generate a low-side drive signal. In one of various examples, the predetermined condition may be a maximum on-time of the low-side switch.

At operation 340, the low-side drive signal may drive a low-side switch.

At operation 350, the high-side drive signal may drive a high-side switch.

The invention claimed is:

1. A device for switch control comprising:

a pulse-width modulator (PWM) circuit, the PWM modulator circuit to receive an input signal and to output a positive polarity PWM signal and a negative polarity PWM signal, the negative polarity PWM signal the complement of the positive polarity signal;

an AND gate with a first input coupled to a trigger event signal and a second input coupled to a low-side active control signal;

a trigger multiplexer with a first input coupled to the negative polarity PWM signal, a second input coupled to a logic low level, and a select input coupled to the output of the AND gate, the output of the trigger multiplexer coupled to a switch, the output of the switch coupled to a low-side drive signal, the low-side drive signal forced to a logic low level based solely on the output of the AND gate;

a low-side switch with a gate node coupled to the low-side drive signal, a source node coupled to a fixed voltage, and a drain node coupled to a load, and a high-side switch with a gate node coupled to the positive polarity PWM signal, a source node coupled to a supply voltage, and a drain node coupled to the load.

2. The device as claimed in claim 1, the trigger event signal based on a maximum on-time of the low-side switch.

3. The device as claimed in claim 1, the low-side switch comprising a power MOSFET.

4. The device as claimed in claim 1, the high-side switch comprising a power MOSFET.

5. The device as claimed in claim 1, the fixed voltage comprising a ground node.

6. A system for switch control comprising:

a pulse-width modulator (PWM) circuit, the PWM circuit to output a positive polarity PWM signal and a negative polarity PWM signal, the negative polarity PWM signal the complement of the positive polarity signal;

a PWM conditioning circuit coupled to the outputs of the PWM circuit, the PWM conditioning circuit to modify the positive polarity PWM signal, and to modify the negative polarity PWM signal, the PWM conditioning circuit to output a high-side drive signal and a low-side drive signal, wherein the PWM conditioning circuit forces the low-side drive signal to an inactive state based on an output of an AND gate and based on a switch coupled to an output of the AND gate, the AND gate with a first input coupled to an output of a central processing unit (CPU) and a second input coupled to a low-side active control signal, the PWM conditioning circuit further comprising:

a high-side dead time generator coupled to the positive polarity PWM signal, a low-side dead-time generator coupled to the negative polarity PWM signal, and a trigger multiplexer with a first input coupled to the output of the low-side dead-time generator, the trigger multiplexer output to force the low-side switch to an inactive state based solely an output of the AND gate;

a first switch coupled to an output of the high-side dead-time generator, the first switch to force the high-side switch to an active state, and a second switch coupled to the output of the low-side dead-time generator, the second switch to force the low-side switch to an active state;

a low-side switch with a gate node directly coupled to the low-side drive signal, a source node coupled to a fixed voltage, and a drain node coupled to a load, and a high-side switch with a gate node coupled to the high-side drive signal, a source node coupled to a supply voltage, and a drain node coupled to the load.

7. The system as claimed in claim 6, the predetermined condition comprising a maximum on-time of the low-side switch.

8. The system as claimed in claim 6, the PWM circuit comprising a PWM generator, a swap circuit to swap the output of the PWM generator based on a swap signal, a first multiplexer coupled to the output of the swap circuit, and a second multiplexer coupled to the output of the first multiplexer.

9. The system as claimed in claim 8, the first multiplexer to produce a logic low output based on a de-asserted low-side active control signal and to pass the output of the swap circuit based on an asserted low-side active control signal.

10. The system as claimed in claim 9, the second multiplexer to produce a logic high output based on a de-asserted high-side active control signal and to pass the output of the first multiplexer based on an asserted low-side active control signal.

11. The system as claimed in claim 10, the PWM conditioning circuit comprising:

a high-side multiplexer coupled to the output of the first switch, the high-side multiplexer to output a logic low value based on a high-side inactive control signal;

a low-side multiplexer coupled to the output of the second switch, the low-side multiplexer to output a logic low value based on a low-side inactive control signal;

a high-side XOR gate with a first input coupled to the output of high-side multiplexer and a second input coupled to a high-side polarity select signal, the output of the high-side XOR gate comprising the high-side drive signal, and a low-side XOR gate with a first input coupled to the output of the low-side multiplexer and a second input coupled to a low-side polarity select signal, the output of the low-side XOR gate comprising the low-side drive signal.

12. A method for switch control comprising:

generating a positive polarity PWM signal and a negative polarity PWM signal, the negative polarity PWM signal the complement of the positive polarity PWM signal;

modifying the positive polarity PWM signal to generate a high-side drive signal;

forcing the negative polarity PWM signal to an inactive state based solely on an output of an AND gate to generate a low-side drive signal, the AND gate comprising a first input coupled to a trigger event signal and a second input coupled to a low-side active control signal;

forcing the low-side drive signal high by a switch;

driving a low-side switch with the low-side drive signal, and driving a high-side switch with the high-side drive signal.

13. The method as claimed in claim 12, the generating the positive polarity PWM signal comprising swapping the positive polarity PWM signal and the negative polarity PWM signal based on a swap signal, forcing the positive polarity PWM signal to a logic low level based on a de-asserted low-side active control signal and forcing the positive polarity PWM signal to a logic high level based on a de-asserted high-side active control signal.

14. The method as claimed in claim 12, the generating the negative polarity PWM signal comprising swapping the negative polarity PWM signal and the positive polarity PWM signal based on a swap signal, forcing the negative polarity PWM signal to a logic high level based on a de-asserted low-side active control signal and forcing the negative polarity PWM signal to a logic high level based on a de-asserted high-side active control signal.

15. The method as claimed in claim 12, the low-side switch comprising a power MOSFET.

16. The method as claimed in claim 12, the high-side switch comprising a power MOSFET.

17. The method as claimed in claim 12, the trigger event signal based on a maximum on-time of the low-side switch.

18. The device as claimed in claim 1, the device comprising a microcontroller.

19. The method as claimed in claim 12, the trigger event signal input from a microcontroller.

20. The system as claimed in claim 6, the system comprising a microcontroller.

* * * * *